(12) United States Patent
Choi et al.

(10) Patent No.: US 12,283,464 B2
(45) Date of Patent: Apr. 22, 2025

(54) PLASMA REACTION DEVICE

(71) Applicant: NEW POWER PLASMA CO., LTD., Suwon-si (KR)

(72) Inventors: Dai Kyu Choi, Seoul (KR); Eun Seok Lim, Suwon-si (KR)

(73) Assignee: NEW POWER PLASMA CO., LTD., Suwon-si (KR)

( * ) Notice: Subject to any disclaimer, the term of this patent is extended or adjusted under 35 U.S.C. 154(b) by 161 days.

(21) Appl. No.: 18/010,539

(22) PCT Filed: Jul. 29, 2020

(86) PCT No.: PCT/KR2020/010003
§ 371 (c)(1),
(2) Date: Dec. 15, 2022

(87) PCT Pub. No.: WO2021/256606
PCT Pub. Date: Dec. 23, 2021

(65) Prior Publication Data
US 2023/0245857 A1   Aug. 3, 2023

(30) Foreign Application Priority Data
Jun. 16, 2020   (KR) .................. 10-2020-0073079

(51) Int. Cl.
*H01J 37/00*   (2006.01)
*H01J 37/32*   (2006.01)

(52) U.S. Cl.
CPC ........ *H01J 37/32357* (2013.01); *H01J 37/32* (2013.01); *H01J 37/32522* (2013.01); *H01J 37/32669* (2013.01)

(58) Field of Classification Search
CPC ........... H01J 37/32357; H01J 37/32522; H01J 37/32669; H01J 37/321; H01J 37/3211;
(Continued)

(56) References Cited

U.S. PATENT DOCUMENTS 6,254,738 B1   7/2001   Stimson et al.
6,816,029 B2   11/2004   Choi et al.
(Continued)

FOREIGN PATENT DOCUMENTS

JP   2009-123505 A   6/2009
KR   10-2002-0039592 A   5/2002
(Continued)

*Primary Examiner* — Tuan T Lam
(74) *Attorney, Agent, or Firm* — Bridgeway IP Law Group, PLLC; Sang Ho Lee; Hyun Woo Shin (57) ABSTRACT

Provided is a plasma reaction device which can reduce a heating value through installation of a dual-coil type inductor in a resonant network circuit part, and a cooling method thereof. The plasma reaction device may include: a reactor part for exciting an input gas to be in a plasma state by using transformer coupled plasma; a resonant network circuit part electrically connected to the reactor part and including at least one inductor and at least one condenser; and a power supply part for applying power to the resonant network circuit part, wherein the inductor may comprise: a first coil which is formed between a first terminal and a second terminal and at least a portion of which is spirally wound to form a first cylindrical reception space inward; and a second coil which is formed between the first terminal and the second terminal to be connected to the first coil in series, and spirally wound in the first cylindrical reception space.

6 Claims, 11 Drawing Sheets

(58) Field of Classification Search
CPC . H01J 37/32183; H01J 37/32; H01J 37/32174
See application file for complete search history.

(56) References Cited

U.S. PATENT DOCUMENTS

| | | | |
|---|---|---|---|
| 8,398,815 B2 | 3/2013 | Yamazawa et al. | |
| 11,699,576 B2 * | 7/2023 | Okunishi | H01J 37/32724 |
| | | | 156/345.52 |
| 2007/0284344 A1 * | 12/2007 | Todorov | H01J 37/32706 |
| | | | 219/121.54 |
| 2016/0079038 A1 * | 3/2016 | Okunishi | H01J 37/32798 |
| | | | 315/111.21 |
| 2023/0402255 A1 * | 12/2023 | Lane | H01J 37/321 |
| 2024/0021415 A1 * | 1/2024 | Kojima | C23C 14/564 |
| 2024/0170254 A1 * | 5/2024 | Fu | H01J 37/3211 |
| 2024/0177971 A1 * | 5/2024 | Wi | H01J 37/32183 |

FOREIGN PATENT DOCUMENTS

| | | |
|---|---|---|
| KR | 10-0602258 B1 | 7/2006 |
| KR | 10-2016-0129304 A | 11/2016 |
| KR | 10-2017-0050616 A | 5/2017 |

\* cited by examiner

PLASMA REACTION DEVICE

TECHNICAL FIELD

The present invention relates to a plasma reaction device, and more particularly, to a plasma reaction device which can reduce a heating value through installation of a dual-coil type inductor in a resonant network circuit part, and a cooling method thereof.

BACKGROUND ART

Plasma discharge is used for gas excitation to generate an active gas including ions, free radicals, atoms and molecules. An active gas is widely used in various fields. An active gas is generally used in semiconductor fabrication processes, for example, such as etching, deposition, cleaning, ashing, and the like.

Recently, a wafer or a liquid crystal display (LCD) glass substrate for manufacturing a semiconductor device becomes larger. However, there is a need of an easily extensible plasma source having a high capability for controlling of plasma ion energy and a capability for processing a large area.

It is known that remotely using the plasma is very useful in the process of manufacturing the semiconductor using plasma.

For example, the remote use of the plasma has been usefully used in a cleaning of a process chamber or an ashing process for a photoresist strip. However, since a volume of the process chamber increases according to the enlargement of a substrate to be processed, a plasma source capable of remotely and sufficiently supplying high-density activated gas has been demanded.

In the meantime, a remote plasma reactor (or remote plasma generator) uses a transformer coupled plasma source or an inductively coupled plasma source. The remote plasma reactor using the transformer coupled plasma source has a structure in which a magnetic core having a first winding coil is mounted a reactor body having a toroidal structure. The remote plasma reactor using the inductively coupled plasma source has a structure in which an inductively coupled antenna is mounted in a reactor body having a hollow tube structure.

For example, a gas injected into the plasma reactor makes a gaseous material into a plasma form containing ions, free radicals, atoms, and molecules by electrical force, and the plasma is used at a distance for various purposes such as etching, deposition, cleaning, or the like.

As described in Korean Patent Application Publication No. 10-2016-0129304, technology of a conventional plasma reactor including a cooling kit on a magnetic core where an induced electromotive force is generated to prevent overheating of the magnetic core and reduce power loss has been developed.

However, in such a conventional plasma reactor, heat is concentrated in an inductor of a resonance network circuit part for plasma generation, that is, the coil, and the high-temperature thermal energy concentrated in the coil imposes thermal stress to the entire reactor, greatly deteriorating the overall heat dissipation performance. The coil that occupies large volume causes an increase in the size of equipment, leading to significantly low space utilization.

DETAILED DESCRIPTION OF THE INVENTION

Technical Problem

The present invention aims to solve several problems including the aforementioned problems and to provide a plasma reaction device which can significantly reduce a heating value by forming an inductor, which occupies a large volume and weight in a resonant network circuit part, as a dual-coil type inductor, and accordingly improve the heat dissipation performance of equipment. Also, since, in the dual-coil type inductor, a small coil is connected in parallel to a large coil in a cylindrical space inside the large coil so that a heating value can be reduced even in the same area, the plasma reaction device has a high space utilization, and accordingly allows a high power capacity to be implemented in equipment with a small volume. However, this objective is merely exemplary and is not intended to limit the scope of the present invention.

Technical Solution

A plasma reaction device according to the present invention for solving the above problem may include a reactor part configured to excite an input gas to be in a plasma state; a resonant network circuit part electrically connected to the reactor part and including at least one inductor and at least one condenser; and a power supply part configured to apply power to the resonant network circuit part, wherein the inductor may include: a first coil formed between a first terminal and a second terminal and having at least a portion spirally wound to form a first cylindrical reception space inside thereof; and a second coil formed between the first terminal and the second terminal spirally wound in the first cylindrical reception space.

In addition, according to the present invention, the second coil may be formed between the first terminal and the second terminal so as to be connected in parallel or in series to the first coil, and may have a dual-coil shape in which the second coil is wound around the same axis with the same spacing or same pitch as that of the first coil so as to make contact with an inner side surface of the first coil.

In addition, according to the present invention, the first coil and the second coil may be formed to have the same thickness, and have an insulating outer layer on an outer surface thereof or a cooling line formed therein.

In addition, according to the present invention, the inductor may include: a third coil formed between a third terminal and a fourth terminal and having at least a portion spirally wound to form a second cylindrical reception space inside thereof; and a fourth coil formed between the third terminal and the fourth terminal to be connected in parallel to the third coil and spirally wound in the second cylindrical reception space.

In addition, according to the present invention, a first inductor, consisting of the first coil and the second coil, may be connected in series to a second inductor, consisting of the third coil and the fourth coil, with the condenser interposed therebetween, or a third inductor may be additionally provided and the first coil and the second coil may be connected in parallel to each other or connected in series to each other by a switch.

In addition, according to the present invention, the reactor part may include: a reactor body having a gas inlet formed on one side thereof and a plasma outlet formed on the other side thereof and having an annular loop space formed therein; and a magnetic core formed in a shape surrounding at least a portion of the reactor body and having a primary winding to generate a transformer coupled plasma by exciting the gas in the annular loop space.

In addition, the plasma reaction device according to the present invention may further include a case surrounding the reactor part, the resonant network circuit part, and the power supply part, wherein the resonant network circuit part may include: a tank board provided in front of or on a side of the reactor body or the magnetic core; the at least one inductor provided in the tank board; and the at least one condenser provided in the tank board, and a blower configured to induce air toward the coils may be provided in the case.

Advantageous Effects

According to a plasma reaction device in accordance with an embodiment of the present invention, an inductor that occupies a large volume and weight in a resonant network circuit part is formed as a dual-coil type inductor to reduce resistance, thereby greatly reducing a heating value and accordingly improving the heat dissipation performance of equipment. Also, since, in the dual-coil type inductor, a small coil is connected in parallel to a large coil in a cylindrical space inside the large coil, a heating value can be reduced even in the same volume, which leads to high space utilization, and accordingly, it is possible to implement a high power capacity even for equipment with a small volume. It should be noted that the scope of the present invention is not limited to the effects described above.

BEST MODE FOR INVENTION

Hereinafter, several preferred embodiments of the present invention will be described in detail with reference to the accompanying drawings.

The embodiments of the present invention are provided for more fully describing the present invention to those skilled in the art, and the embodiments below may be modified in various forms, and the scope of the present invention is not limited to the embodiments below. Rather, these embodiments are provided such that this disclosure will be thorough and complete and will fully convey the spirit of the present invention to those skilled in the art. Further, in the drawings, a thickness or a size of each layer is exaggerated for convenience and clarity of description.

Figure 1:
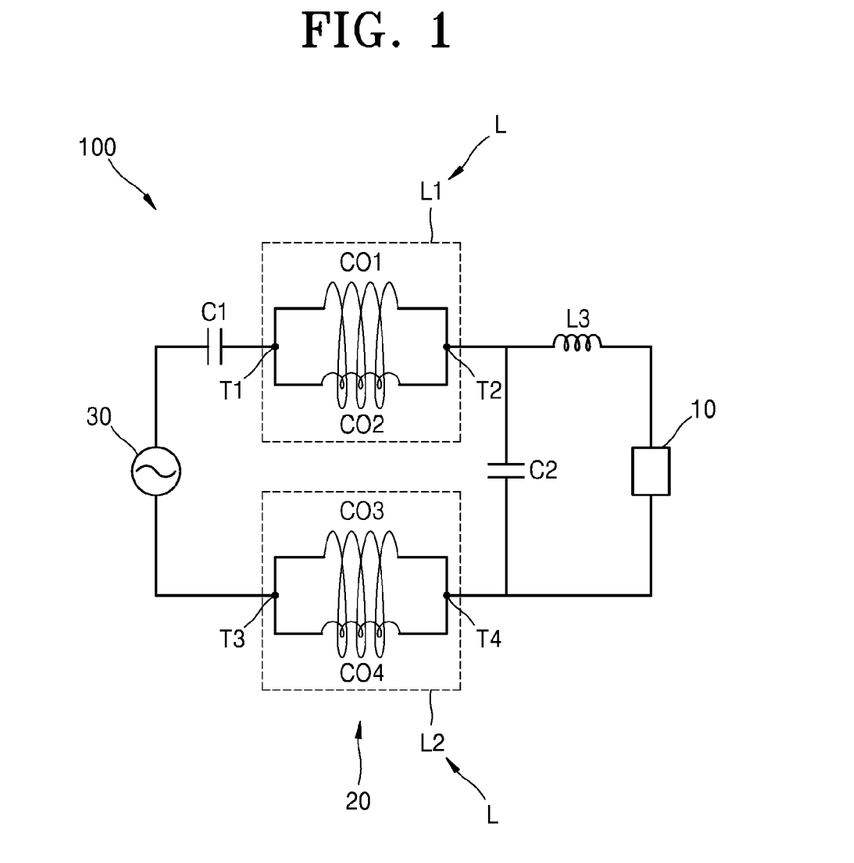
FIG. 1 is a circuit diagram conceptually illustrating a plasma reaction device according to some embodiments of the present invention.
Figure 2:
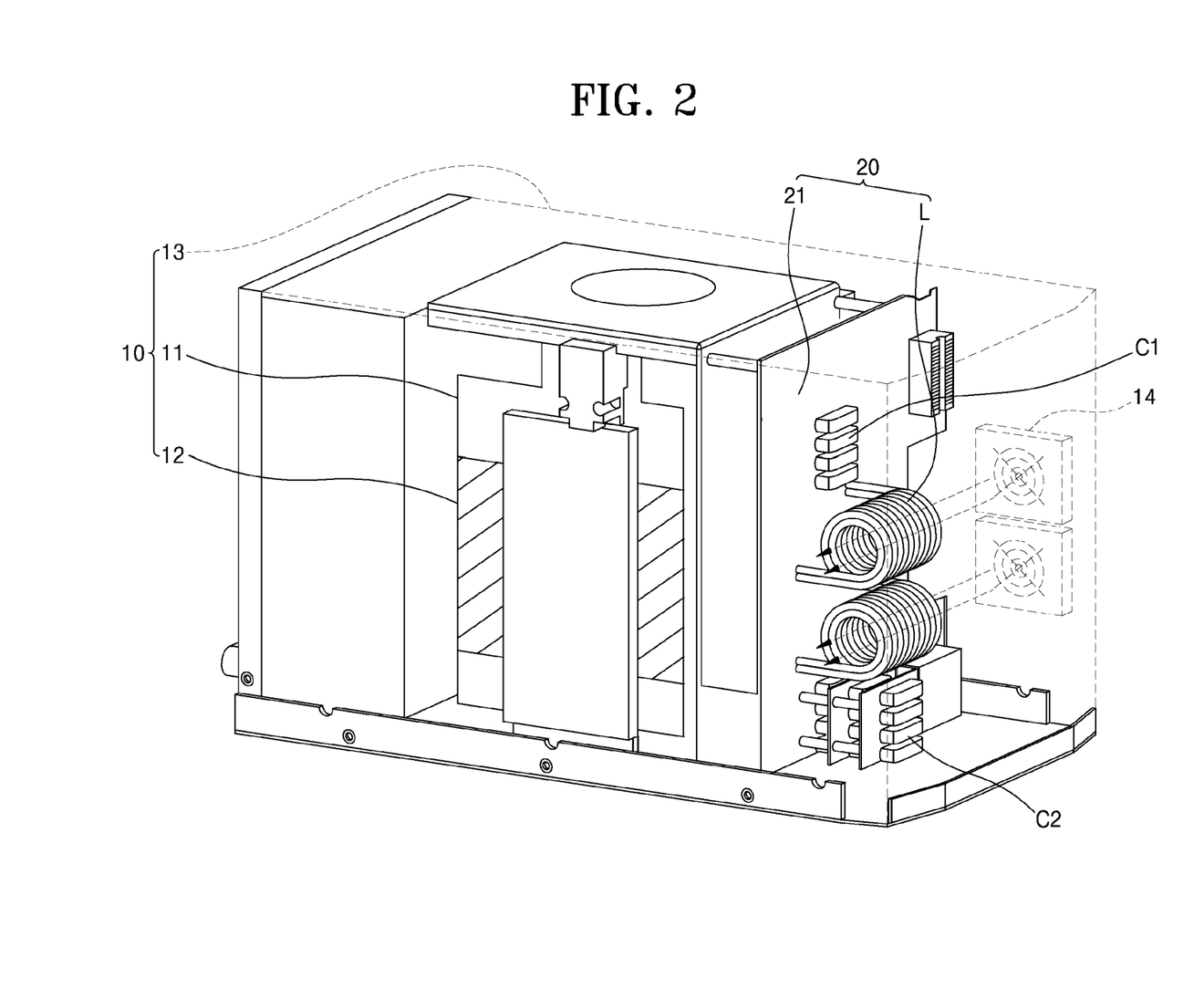
FIG. 2 is a perspective view showing the plasma reaction device of FIG. 1.
Figure 3:
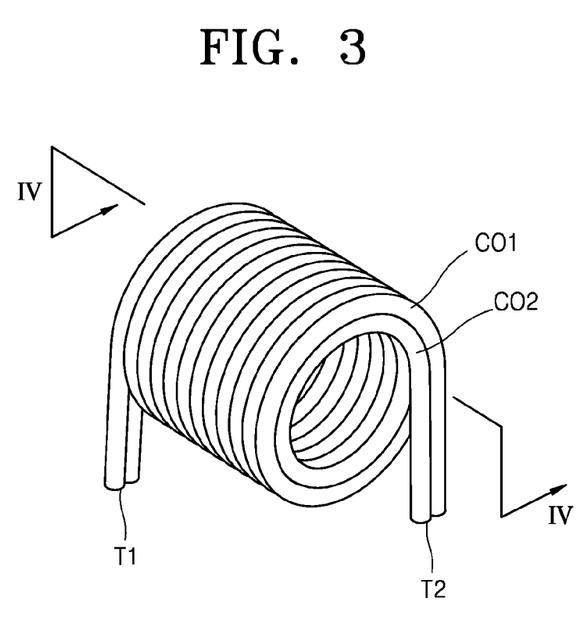
FIG. 3 is an enlarged perspective view illustrating an example of an inductor of the plasma reaction device of FIG. 2.
Figure 4:
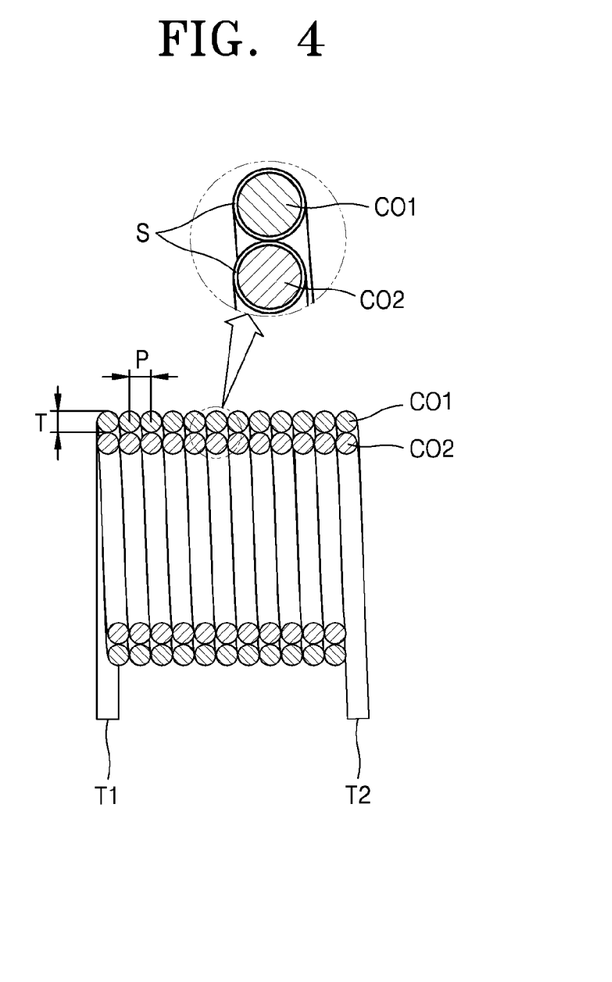
FIG. 4 is a cross-sectional view illustrating an example of an IV-IV cross section of the inductor of the plasma reaction device of FIG. 3.

FIG. 1 is a circuit diagram conceptually illustrating a plasma reaction device 100 according to some embodiments of the present invention, FIG. 2 is a perspective view illustrating the plasma reaction device 100 of FIG. 1, and FIG. 3 is an enlarged perspective view illustrating an inductor L of the plasma reaction device 100 of FIG. 2, and FIG. 4 is a cross-sectional view illustrating an IV-IV cross section of the inductor L of the plasma reaction device 100 of FIG. 3.

First, as shown in FIG. 1, the plasma reaction device 100 according to some embodiments of the present invention may include a reactor part 10 configured to excite an input gas to be in a plasma state by using transformer coupled plasma, a resonant network circuit part 20 electrically connected to the reactor part 10 and including at least one inductor L and at least one condenser C1 and C2, and a power supply part 30 configured to supply power to the resonant network circuit part 20.

Here, the inductor L may include a first inductor L1 consisting of a first coil CO1 and includes a first inductor L1 comprising a first coil CO1 and a second coil CO2, a second inductor L2 consisting of a third coil CO3 and a fourth coil CO4, wherein the first inductor L1 and the second inductor L2 may be connected in series to each other with the condenser C2 interposed therebetween. In addition, a third inductor L3 may be additionally provided, if necessary.

In particular, as shown in FIGS. 2 to 4, the first inductor L1 may include the first coil CO1 formed between a first terminal T1 and a second terminal T2 and having at least a portion spirally wound to form a first cylindrical reception space inside thereof and a second coil CO2 formed between the first terminal T1 and the second terminal T2 to be connected in parallel to the first coil CO1 and spirally wound in the first cylindrical reception space.

Also, as shown in FIGS. 1 to 4, similarly, the second inductor L may include the third coil CO3 formed between a third terminal T3 and a fourth terminal T4 and having at least a portion spirally wound to form a second cylindrical reception space inside thereof and the fourth coil CO4 formed between the third terminal T3 and the fourth terminal T4 to be connected in parallel to the third coil CO3 and spirally wound in the second cylindrical reception space.

Accordingly, as shown in FIG. 1, the first inductor L1 and the second inductor L2 may be connected in series to each other with the condenser C2 interposed therebetween, but the first coil CO1 and the second coil CO2 may be connected in parallel to each other between the first terminal T1 and the second terminal T2.

Similarly, as shown in FIG. 1, the above-described third coil CO3 and fourth coil CO4 may also be connected in parallel to each other between the third terminal T3 and the fourth terminal T4.

However, the first coil CO1, the second coil CO2, the third coil CO3, and the fourth coil CO4 are not necessarily limited to the drawings. For example, when the all coils have the same thickness and the same pitch, lengths of internal coils, i.e., the lengths of the second coil CO2 and the fourth coil CO4, may be shortened, and thus the resistance value may be relatively decreased or the resonance properties may be deteriorated.

Therefore, in order to control the resistance value, for example, the thickness of the second coil CO2 and the thickness of the fourth coil CO4 may be slightly thicker than the thickness of the first coil CO31 and the thickness of the third coil CO3.

Also, the pitches of the second coil CO2 and the fourth coil CO4 may be smaller than the pitches of the first coil CO1 and the third coil CO3.

In addition, dual coils may be formed in very various combinations, such as slightly increasing the length of a portion of the coil.

Therefore, as shown in FIG. 1, the inductor, which occupies a relatively large volume and weight in the resonant network circuit part, may be formed as a dual-coil type inductor to reduce resistance, thereby significantly reducing a heating value and thus greatly improving the heat dissipation performance of equipment.

Meanwhile, as shown in FIGS. 2 to 4, the second coil CO2 may have a dual-coil shape in which the second coil CO2 is wound around the same axis with the same spacing or same pitch P as that of the first coil CO1 so as to make contact with an inner side surface of the first coil CO1.

That is, as shown in FIGS. 3 and 4, the first coil CO1 and the second coil may be formed to have the same thickness T, and an insulating outer layer S may be formed on the outer surface of each of the first coil CO1 and the second coil.

Therefore, since, in the dual-coil type inductor, a small coil is connected in parallel to a large coil in a cylindrical space inside the large coil, so that resistance is theoretically reduced by half even in the same volume, resistive heat, i.e., a heating value, can be significantly reduced as the resistance is reduced, which leads to high space utilization, and accordingly, it is possible to implement a high power capacity even for equipment with a small volume.

Meanwhile, as shown in FIG. 2, the reactor part 10 of the plasma reaction device 100 according to some embodiments of the present invention may include a reactor body 11 having a gas inlet formed on one side thereof and a plasma outlet formed on the other side thereof and having an annular loop space formed therein, a magnetic core 12 formed in a shape surrounding at least a portion of the reactor body 11 and having a primary winding to generate a plasma by exciting the gas in the annular loop space, and a case 13 surrounding the reactor part 10, the resonant network circuit part 20, and the power supply part 30.

Here, as shown in FIG. 2, the resonant network circuit part 20 may include a tank board 21 provided in front of or on a side of the reactor body 11 or the magnetic core 12, the at least one inductor L provided in the tank board 21, and the at least one condenser C1 and C2 provided in the tank board 21.

In particular, a blower 14 configured to induce air toward the coils is provided in the case 13, so that the air flowing in a direction of the cylindrical space inside the dual-coil type inductor L is in thermal contact with the inductor L to realize air cooling.

Here, although not illustrated, a simultaneous winding method of simultaneously spirally winding two wires may be applied to the dual-coil type inductor L, or the dual-coil type inductor L may be manufactured through a separate insertion method of fabricating a large coil first and then inserting a small coil inside the large coil. However, the present invention is not necessarily limited to these methods, and the inductor L may be manufactured through various methods.

Figure 5:
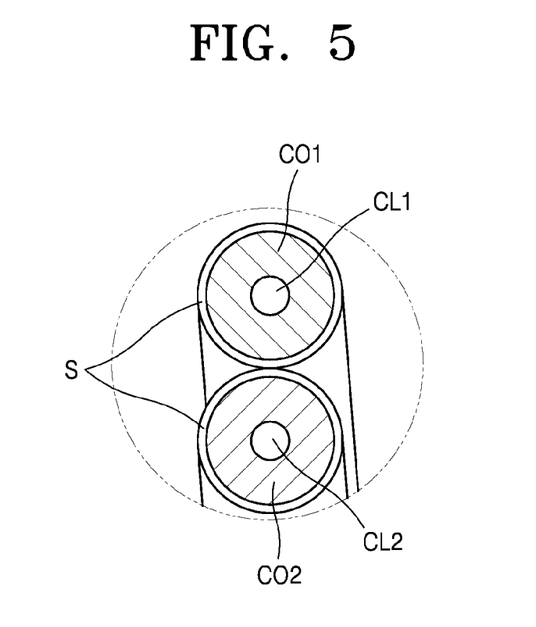
FIG. 5 is an enlarged cross-sectional view illustrating another example of the inductor of the plasma reaction device of FIG. 1.

FIG. 5 is an enlarged cross-sectional view illustrating another example of the inductor of the plasma reaction device of FIG. 1.

As shown in FIG. 5, the first coil CO1 and the second coil CO2 of the inductor may have a first cooling line CL1 and a second cooling line CL2 formed respectively therein for cooling. In these cooling lines, various types of refrigerants such as air, inert gas, cooling water, and cooling oil may be circulated.

Figure 6:
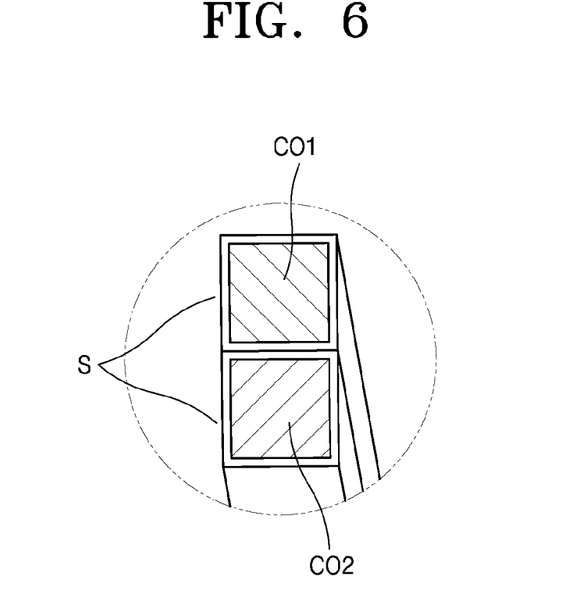
FIG. 6 is an enlarged cross-sectional view illustrating yet another example of the inductor of the plasma reaction device of FIG. 1.

FIG. 6 is an enlarged cross-sectional view illustrating yet another example of the inductor of the plasma reaction device of FIG. 1.

In addition, for example, as shown in FIG. 6, the cross-sections of the first coil CO1 and the second coil CO2 are not limited to a wire shape having a circular cross-section. In addition to the circular wire shape, any wires having a wide variety of cross-sectional shapes, such as a rectangular shape, a polygonal shape, and the like, to increase a filling rate of a space may be applied. The shape of the cross-section may be formed in various ways in consideration of cooling efficiency and the like.

Figure 7:
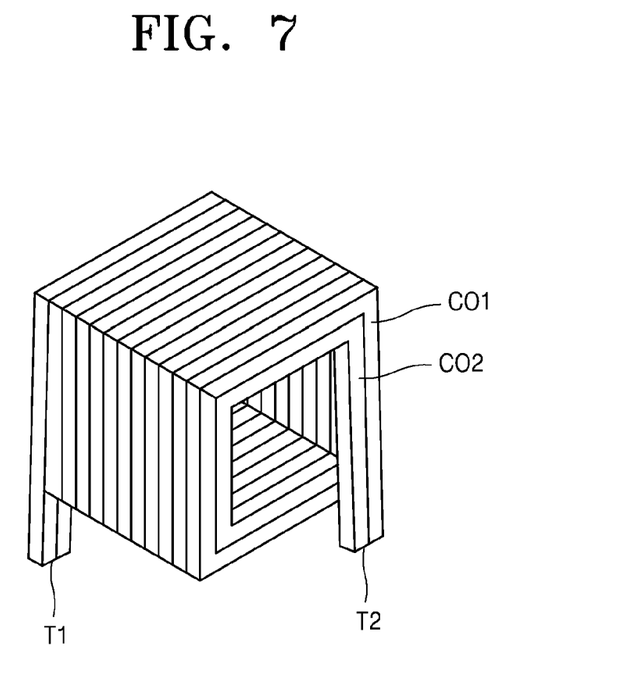
FIG. 7 is an enlarged perspective view illustrating yet another example of the inductor of the plasma reaction device of FIG. 1.

FIG. 7 is an enlarged perspective view illustrating yet another example of the inductor of the plasma reaction device of FIG. 1.

Also, as shown in FIG. 7, the first coil CO1 and the second coil CO2 may be wound in a rectangular cylindrical shape as a whole. That is, the internal cylindrical space is not necessarily limited to a cylindrical shape, and the coils may be wound in various shapes, such as a rectangular cylindrical shape, a polygonal cylindrical shape, an oval cylindrical shape, and the like.

Figure 8:
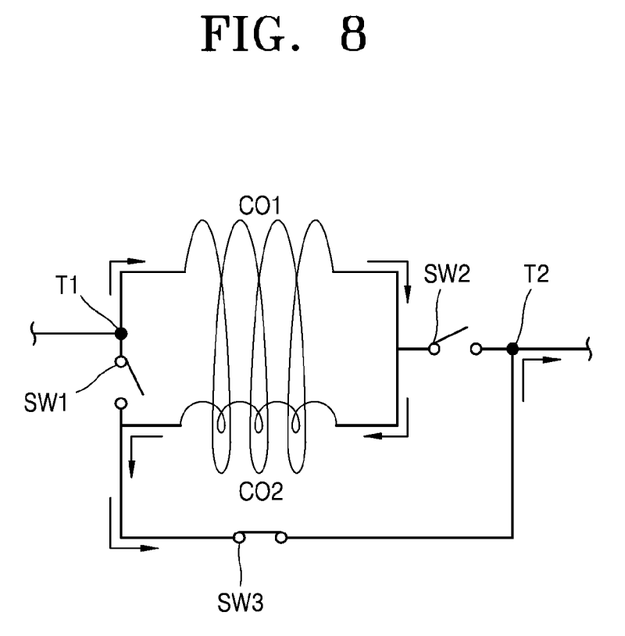
FIG. 8 is a circuit diagram illustrating a reverse series connection mode of an inductor of a plasma reaction device according to some other embodiments of the present invention.
Figure 9:
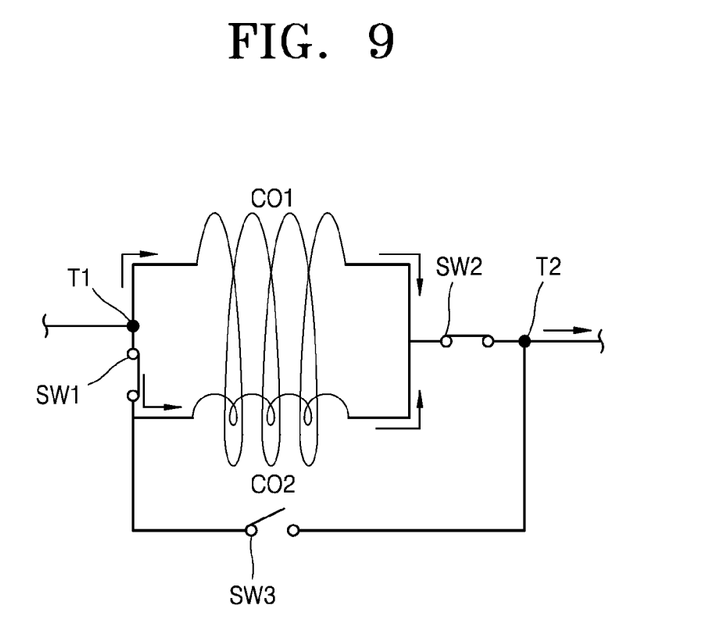
FIG. 9 is a circuit diagram illustrating a forward parallel connection mode of the inductor of the plasma reaction device of FIG. 8.

FIG. 8 is a circuit diagram illustrating a reverse series connection mode of an inductor of a plasma reaction device according to some other embodiments of the present invention and FIG. 9 is a circuit diagram illustrating a forward parallel connection mode of the inductor of the plasma reaction device of FIG. 8.

In addition, for example, in an inductor of a plasma reaction device according to some other embodiments of the present invention, the first coil CO1 and the second coil CO2 may be connected to each other by using switches SW1, SW2, and SW3 in reverse series connection mode of FIG. 8 or in forward parallel connection mode of FIG. 9.

Therefore, for example, when the first switch SW1 is disconnected and the third switch SW3 is connected in a state in which the second switch SW2 is disconnected as shown in FIG. 8, the first coil CO1 and the second coil (CO2) are connected in series to each other, and at the same time, the current flow directions (arrow direction) of the first coil CO1 and the second coil CO2 are opposite to each other, resulting in an electromagnetic induction effect or attenuation of surrounding electromagnetic waves.

Also, for example, when the first switch SW1 is connected and the third switch SW3 is disconnected in a state in which the second switch SW2 is connected as shown in FIG. 9, the first coil CO1 and the second coil CO2 may be connected in parallel to each other, and at the same time, the current flow directions of the first coil CO1 and the second coil CO2 may become the same as each other.

Therefore, the application may be made in various ways, such as connecting the first coil CO1 and the second coil CO2 in series or in parallel to each other, adjusting a resistance value, controlling the electromagnetic induction effect, controlling the surrounding electromagnetic waves, and the like, according to a required condition.

In addition, although not illustrated, various types of coils may be combined and applied in various forms by using various switches, position variable devices, storage variable devices, and the like.

Figure 10:
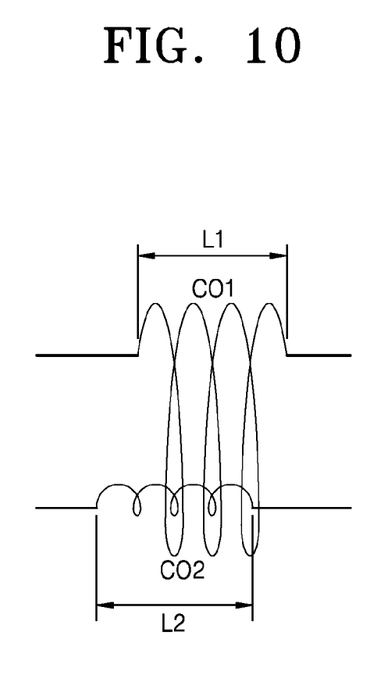
FIG. 10 is a circuit diagram illustrating yet another example of the inductor of the plasma reaction device of FIG. 1.

FIG. 10 is a circuit diagram illustrating yet another example of the inductor of the plasma reaction device of FIG. 1.

As shown in FIG. 10, the first coil CO1 and the second coil CO2 of the inductor may differ in the starting point or the ending point from each other, or a first length L1 of the first coil CO1 and a second length L2 of the second coil CO2 may be the same or different from each other. Thus, the application may be made in various ways by precisely controlling a phase difference of an induced electromotive force or a signal characteristic based on the change in the coil position or the change in the length of the coil. In addition, although not illustrated, various changes may be made to the winding diameter of the coils or the like.

Figure 11:
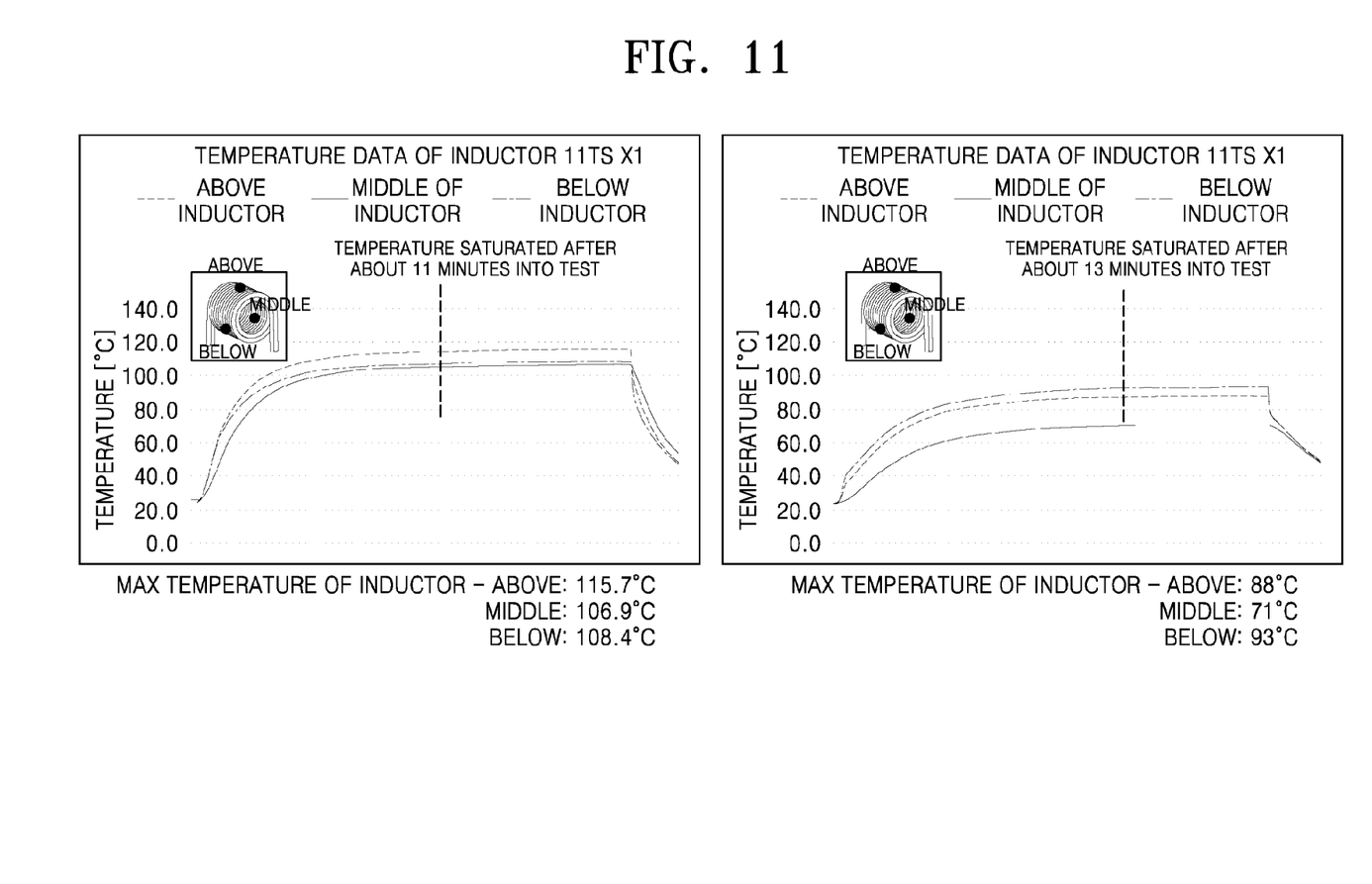
FIG. 11 is a graph showing test results of the plasma reaction device of FIG. 1.

FIG. 11 is a graph showing test results of the plasma reaction device of FIG. 1.

As shown in FIG. 11, the left graph of FIG. 11 is a graph of temperature data results obtained by evaluating a conventional plasma reaction device using a single-core type inductor and the right graph of FIG. 11 is a graph of temperature data results obtained by evaluating the plasma reaction device 100 of the present invention using a dual-coil type inductor.

As shown in FIG. 11, only the shape of the inductor is changed, and a voltage (210V), a type of gas (oxygen), initial power (15 kW), and cooling water (process-cooling water (PCW), 9 L, 7 L)) are the same in all plasma reaction devices.

First, as shown in the left graph, in the conventional plasma reaction device, at about 11 minutes into the test, temperature data at all points above, in the middle, and below the single-coil type inductor reach a saturation state in which the temperature no longer rises. At this time, it can be seen that the maximum temperature value of the inductor is 115.7 degrees Celsius at the upper point, 106.9 degrees Celsius at the middle point, and 108.4 degrees Celsius at the lower point.

In contrast, as shown in the right graph, in the plasma reaction device 100 according to some embodiments of the present invention, at about 13 minutes into the test, temperature data at all points above, in the middle, and below the dual-coil type inductor reach a saturation state in which the temperature no longer rises. At this time, it can be seen that the maximum temperature value of the inductor is 88 degrees Celsius at the upper point, 71 degrees Celsius at the middle point, and 93 degrees Celsius at the lower point.

As compared to the conventional plasma reaction device, the temperature saturation time can be delayed by 10 percent or more and the maximum temperature can be lowered by 20 degrees or more, and hence it can be seen that there is sufficient criticality of the effect in terms of the heat dissipation performance, which must reduce the temperature by even just a few percent or even just a few degrees.

While this invention has been particularly shown and described with reference to preferred embodiments thereof, it will be understood by those skilled in the art that various changes in form and details may be made therein without departing from the spirit and scope of the invention as defined by the appended claims. The preferred embodiments should be considered in descriptive sense only and not for purposes of limitation. Therefore, the scope of the invention is defined not by the detailed description of the invention but by the appended claims, and all differences within the scope will be construed as being included in the present invention.

INDUSTRIAL APPLICABILITY

According to the plasma reaction device in accordance with an embodiment of the present invention, an inductor that occupies a large volume and weight in a resonant network circuit part is formed as a dual-coil type inductor to reduce resistance, thereby greatly reducing a heating value and accordingly improving the heat dissipation performance of equipment. Also, since, in the dual-coil type inductor, a small coil is connected in parallel to a large coil in a cylindrical space inside the large coil, a heating value can be reduced even in the same volume, which leads to high space utilization, and accordingly, it is possible to implement a high power capacity even for equipment with a small volume.

The invention claimed is:

1. A plasma reaction device comprising:
a reactor part configured to excite an input gas to be in a plasma state;
a resonant network circuit part electrically connected to the reactor part and including at least one inductor and at least one condenser; and
a power supply part configured to apply power to the resonant network circuit part, wherein the inductor comprises:
a first coil formed between a first terminal and a second terminal and having at least a portion spirally wound to form a first cylindrical reception space inside thereof; and
a second coil formed between the first terminal and the second terminal spirally wound in the first cylindrical reception space,
wherein the reactor part comprises:
a reactor body having a gas inlet formed on one side thereof and a plasma outlet formed on the other side thereof and having an annular loop space formed therein; and
a magnetic core formed in a shape surrounding at least a portion of the reactor body and having a primary winding to generate a transformer coupled plasma by exciting the gas in the annular loop space.

2. The plasma reaction device of claim 1, wherein the second coil is formed between the first terminal and the second terminal so as to be connected in parallel or in series to the first coil, and has a dual-coil shape in which the second coil is wound around the same axis with the same spacing or same pitch as that of the first coil so as to make contact with an inner side surface of the first coil.

3. The plasma reaction device of claim 1, wherein the first coil and the second coil are formed to have the same thickness and have an insulating outer layer on an outer surface thereof or a cooling line formed therein.

4. The plasma reaction device of claim 1, wherein the inductor comprises:

a third coil formed between a third terminal and a fourth terminal and having at least a portion spirally wound to form a second cylindrical reception space inside thereof, and a fourth coil formed between the third terminal and the fourth terminal to be connected in parallel to the third coil and spirally wound in the second cylindrical reception space.

5. The plasma reaction device of claim 4, wherein a first inductor, consisting of the first coil and the second coil, is connected in series to a second inductor, consisting of the third coil and the fourth coil, with the condenser interposed therebetween, or a third inductor is additionally provided, and the first coil and the second coil are connected in parallel to each other or connected in series to each other by a switch.

6. The plasma reaction device of claim 1, further comprising: a case surrounding the reactor part, the resonant network circuit part, and the power supply part, wherein the resonant network circuit part comprises:

a tank board provided in front of or on a side of the reactor body or the magnetic core;

the at least one inductor provided in the tank board; and the at least one condenser provided in the tank board, and a blower configured to induce air toward the coils is provided in the case.

* * * * *